United States Patent
Zhong et al.

(10) Patent No.: US 7,176,094 B2
(45) Date of Patent: Feb. 13, 2007

(54) ULTRA-THIN GATE OXIDE THROUGH POST DECOUPLED PLASMA NITRIDATION ANNEAL

(75) Inventors: Dong Zhong, Singapore (SG); Yun Ling Tan, Singapore (SG); Chew Hoe Ang, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 80 days.

(21) Appl. No.: 10/091,983

(22) Filed: Mar. 6, 2002

(65) Prior Publication Data
US 2003/0170956 A1 Sep. 11, 2003

(51) Int. Cl.
*H01L 21/336* (2006.01)
(52) U.S. Cl. ............ 438/287; 438/724; 438/762; 438/763; 438/775; 438/777; 257/E21.193; 257/E21.625
(58) Field of Classification Search .......... 438/287, 438/724, 762, 763, 775, 776, 777
See application file for complete search history.

(56) References Cited

U.S. PATENT DOCUMENTS

| | | | | |
|---|---|---|---|---|
| 5,436,481 A * | 7/1995 | Egawa et al. | ............... | 257/324 |
| 5,861,329 A | 1/1999 | Yeh et al. | .................... | 438/232 |
| 6,136,654 A * | 10/2000 | Kraft et al. | ................. | 438/287 |
| 6,140,187 A | 10/2000 | DeBusk et al. | ............. | 438/287 |
| 6,162,717 A | 12/2000 | Yeh | ............................ | 438/595 |
| 6,225,169 B1 | 5/2001 | Chew et al. | ................. | 438/287 |
| 6,342,437 B1 | 1/2002 | Moore | ......................... | 438/474 |
| 6,376,316 B2 * | 4/2002 | Shukuri et al. | ............. | 438/275 |
| 6,413,881 B1 * | 7/2002 | Aronowitz et al. | ......... | 438/775 |
| 6,426,305 B1 * | 7/2002 | Chou et al. | ................. | 438/758 |
| 6,632,740 B1 * | 10/2003 | Bertrand et al. | ............ | 438/682 |
| 2003/0153149 A1 * | 8/2003 | Dong et al. | ................. | 438/257 |
| 2003/0157771 A1 * | 8/2003 | Luoh et al. | ................. | 438/287 |

OTHER PUBLICATIONS

"Ultrathin nitrogen-profile engineered gate dielectric film", by S.V. Hattangady et al., IEDM 96-495, 1996 IEEE, 19.1.1 to 19.1.4.
"Plasma nitridation of very thin gate dielectrics," Elsevier Science, B.V. 2001, by H.N. Al-Shereef et al., Microelectronic Engineering 59(2001), pp. 317-322.

* cited by examiner

Primary Examiner—Fernando L. Toledo
(74) Attorney, Agent, or Firm—Saile Ackerman LLC; Stephen B. Ackerman

(57) ABSTRACT

DPN (decoupled plasma nitridation) is used to improve robustness of ultra thin gate oxides. Conventionally, this is followed by an anneal in pure helium to remove structural defects in the oxide. However, annealing under these conditions has been found to cause a deterioration of the electrical performance of devices. This problem has been overcome by annealing, in a 1:4 oxygen-nitrogen mixture (1,050° C. at about 10 torr) instead of in helium or nitrogen oxide. This results in a gate oxide that is resistant to boron contamination without suffering any loss in its electrical properties.

15 Claims, 2 Drawing Sheets

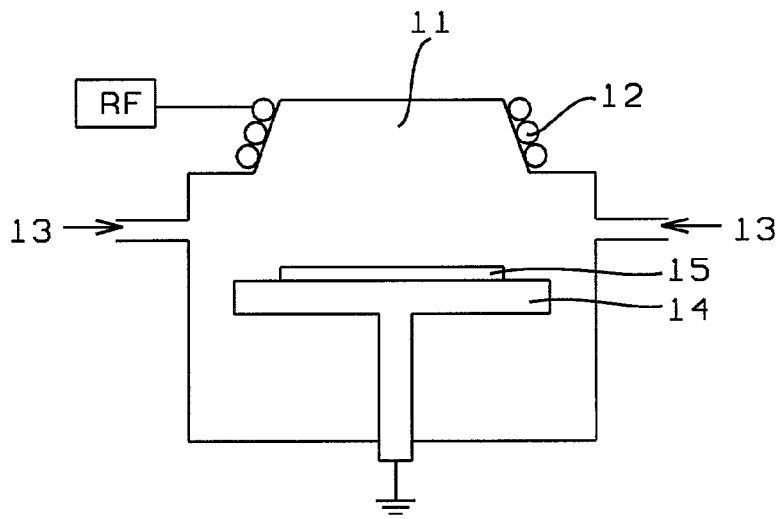
FIG. 1 – Prior Art
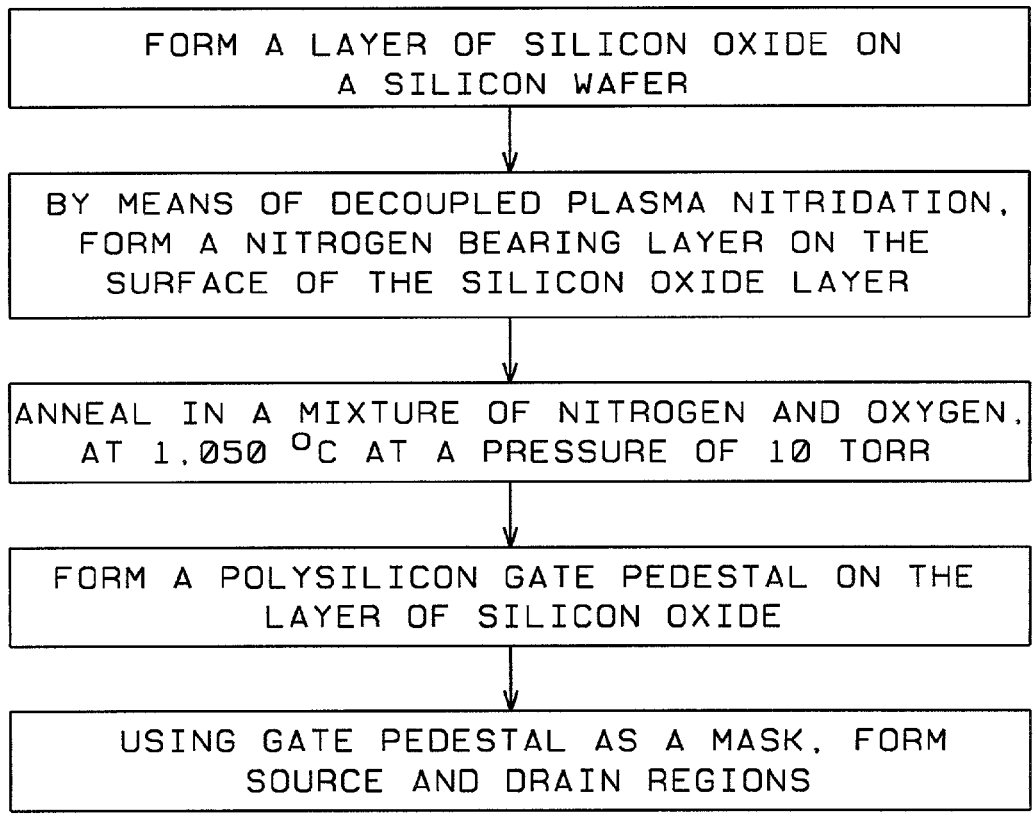
FIG. 2

ULTRA-THIN GATE OXIDE THROUGH POST DECOUPLED PLASMA NITRIDATION ANNEAL

FIELD OF THE INVENTION

The invention relates to the general field of integrated circuits with particular reference to ultra-thin gate oxides and methods to improve their integrity.

BACKGROUND OF THE INVENTION

As the EOT (Equivalent Oxide Thickness) of gate oxides continues to approach less than 20 Angstroms as part of improved CMOS technology, it becomes mandatory to suppress boron penetration through the ultra-thin gate oxide and reduce the oxide leakage current by increasing the nitrogen concentration in the gate oxide. Decoupled-plasma nitridation (DPN) is an emerging new technology for incorporating ultra-high concentrations of nitrogen at the top surface layer of an ultra-thin gate oxide. An example of apparatus used for this is shown in FIG. 1. Through application of RF voltage to external coil 12, a nitrogen plasma is formed in chamber 11. Sample 15, whose surface is to be nitrided, sits on sample holder 14 which positions it to be just below a series of gas inlet ports 13. The key features of the process are the use of inductive coupling for plasma formation. RF power is transferred to the plasma via an RF magnetic field which in turn generates an ionizing electric field. Inductive coupling is much more efficient for plasma production than electroded systems since energy is not dissipated in driving ions into a surface. Not shown in FIG. 1 is the pumping port and throttle valve which, when used in combination with the nitrogen inlet ports 13, are used to establish the equilibrium pressure in the chamber.

Compared to earlier remote-plasma nitridation (RPN) technology, DPN improves the nitrogen uniformity and oxide leakage current considerably. However, due to its low process temperature of less than 100° C., large amount of defects are present in the gate oxide after DPN and the gate oxide integrity is significantly degraded. Hence, post-DPN annealing at high temperature is required to eliminate the oxide defects and improve the oxide integrity.

Such a need is known to the prior art. However, previous prior art practice has been to anneal in pure helium (at a temperature of 1,050° C., pressure of 50 torr, with 5 slm of He flow). These conditions have become standard procedure for the prior art because they offer several advantages, such as no additional oxide growth or nitrogen incorporation during post-DPN annealing. We have, however, determined that annealing under these conditions also has several disadvantages including a deterioration of the electrical performance of devices (such as capacitors and transistors) when they have been subjected to pure helium annealing. The present invention discloses other post-DPN annealing methods for improving the gate oxide integrity and device electrical performance.

A routine search of the prior art was performed with the following references of interest being found:

U.S. Pat. No. 6,140,187 (DeBusk et al.) reveals a remote plasma nitridation process for a gate oxide. A He/Ar plasma is used followed by an anneal in oxygen at about 800° C. In U.S. Pat. No. 5,861,329, Yeh shows a plasma process for forming a barrier layer. Gases used included nitrogen, ammonia, nitrogen oxide, and nitrogen/oxygen mixtures. U.S. Pat. No. 6,225,169B1 (Chew) shows a RTN process in which the nitrided layer is formed on the sidewalls of the gate structure while in U.S. Pat. No. 6,162,717, Yeh et al. use a high density plasma process in which the gate dielectric becomes sandwiched between two layers of silicon nitride.

SUMMARY OF THE INVENTION

It has been an object of at least one embodiment of the present invention to provide a process for forming a field effect transistor.

Another object of at least one embodiment of the present invention has been that said field effect transistor have a gate oxide that is ultra thin, that is a barrier to boron diffusion, and that does not degrade the electrical properties of the device.

Still another object of at least one embodiment of the present invention has been that said process be easily included as part of existing manufacturing processes.

These objects have been achieved by forming a nitrogen bearing layer at the surface of the oxide by means of decoupled plasma nitridation. Following this, instead of a conventional anneal in helium or nitrogen oxide, annealing is performed in a 1:4 oxygen-nitrogen mixture (1,050° C. at about 10 torr). This results in a gate oxide that is resistant to boron contamination without suffering any loss of any of its electrical properties.

BRIEF DESCRIPTION OF THE DRAWINGS

FIG. 1 is a schematic view of apparatus suitable for decoupled plasma nitridation.

FIG. 2 is a flow chart representation of the process of the present invention.

DESCRIPTION OF THE PREFERRED EMBODIMENTS

Figure 3:
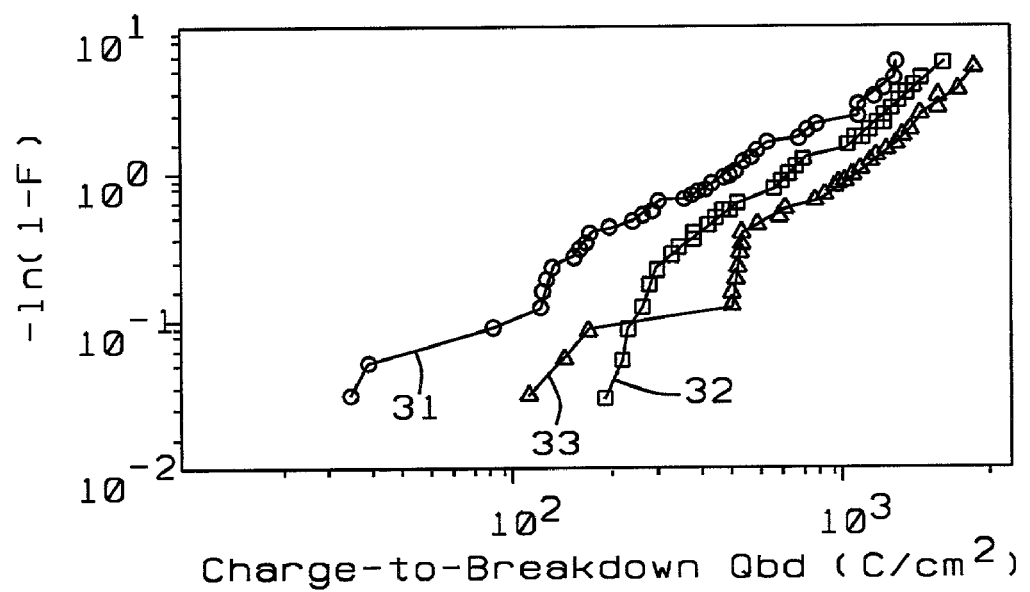
FIG. 3 is a Weibull plot of charge vs. breakdown ratio for three oxide layers annealed in different gases.

We will disclose the present invention by describing a process for the manufacture of a field effect transistor. It will, however, be understood that the process is more general than this and could be applied to other areas of semiconductor technology as well.

The process begins with the provision of a silicon wafer and forming thereon a layer of silicon oxide (typically between about 8 and 30 Angstroms thick). Then, by means of decoupled plasma nitridation using equipment similar to that illustrated in FIG. 1, a nitrogen bearing layer is formed at its upper surface, extending downwards therefrom a distance of between about 2 and 10 Angstroms. This nitrogen bearing layer could be silicon nitride or silicon oxynitride but, regardless of its exact chemical composition, it will contain at least 3 atomic percent nitrogen.

Now follows a key feature of the invention wherein this nitrogen bearing layer is annealed in a mixture of nitrogen and oxygen (having between about 10 and 30 volume percent oxygen with 20% being preferred), at a temperature between about 1,000 and 1,100° C. and a pressure between about 5 and 16 torr, for between about 60 and 150 minutes. As a result of this special anneal, under the conditions specified, the gate oxide layer, including the nitrogen rich layer, becomes substantially free of structural defects. An indication of this improvement can be seen by noting that, prior to the annealing step, the nitrogen bearing layer typically would have a significant concentration of structural defects which, after annealing, will be reduced substantially.

Formation of the field effect transistor is then completed using standard processes including depositing a layer of polysilicon on the layer of silicon oxide and then patterning and etching the former so as to form a gate pedestal (typically having a width between about 0.05 and 0.25 microns) on a layer of gate oxide. Once this has been completed, the gate pedestal is used as a mask during the formation of the source and drain regions (of a conductivity type that is the opposite of that of the silicon wafer) that are self-aligned so that they immediately abut the gate oxide. The above described process has been illustrated and summarized in the flow chart that is shown in FIG. 2.

Using the process described above (in particular the conditions that are specified for the post nitridation anneal), a field effect transistor is formed whose electrical performance is similar to that of a device formed under identical conditions, the only difference being the absence of a nitrogen bearing layer that was formed by decoupled plasma nitridation. Thus the process of the present invention continues to provide a gate oxide layer that suppresses boron penetration and reduces the oxide leakage but without the deterioration in electrical performance associated with prior art processes.

Confirmation of the effectiveness of the process of the present invention is shown in FIG. 3 where we display Weibull plots of charge-to-breakdown ratio (in units of coulombs per sq. cm) for annealing a 20 Å thick oxide layer in three different gases. A Weibull plot is $-\ln(1-F)$, where F is the cumulative failure probability, ranging from 0 to 1. Curve 31 is for a helium anneal, curve 32 is for a nitrogen oxide anneal, and curve 33 is for nitrogen/oxygen anneal (present invention). These results confirm that annealing in $N_2/O_2$ at about 1,050° C., as taught by the present invention, results in a gate oxide having the highest dielectric endurance.

What is claimed is:

1. A process for improving the integrity of a layer of silicon oxide having an upper surface, comprising:
    on a substrate, providing said layer of silicon oxide;
    by means of decoupled plasma nitridation, forming a nitrogen bearing layer that extends downwards a distance from said upper surface; and
    then annealing said nitrogen bearing layer in a mixture of nitrogen and oxygen, at a temperature between about 1,000 and 1,100° C. and a pressure between about 5 and 15 torr, for between about 60 and 150 minutes, whereby said nitrogen bearing layer becomes substantially free of structural defects.

2. The process described in claim 1 wherein the step of decoupled plasma nitridation further comprises using between about 250 and 350 watts of RE power at a pressure of $1-3\times10^{-2}$ torr for 10–300 seconds.

3. The process described in claim 1 wherein said nitrogen bearing layer is selected from the group consisting of silicon nitride and silicon oxynitride.

4. The process described in claim 1 wherein said nitrogen bearing layer contains at least 3 atomic percent nitrogen.

5. The process described in claim 1 wherein said mixture of nitrogen and oxygen contains between about 10 and 30 volume percent oxygen.

6. The process described in claim 1 wherein said distance that said nitrogen bearing layer extends downwards from said upper surface is between about 2 and 10 Angstroms.

7. The process described in claim 1 wherein said layer of silicon oxide has a thickness between about 8 and 30 Angstroms.

8. A process for forming a field effect transistor, comprising:
    providing a silicon wafer, of a first conductivity type, and forming thereon a layer of silicon oxide having an upper surface;
    by means of decoupled plasma nitridation, forming a nitrogen bearing layer that extends downwards a distance from said upper surface;
    then annealing said nitrogen bearing layer in a mixture of nitrogen and oxygen, at a temperature between about 1,000 and 1,100° C. and a pressure between about 5 and 15 torr, for between about 60 and 150 minutes, whereby said nitrogen bearing layer becomes substantially free of structural defects;
    depositing a layer of polysilicon on said layer of silicon oxide;
    patterning and etching said layer of polysilicon and said layer of silicon oxide to form a gate pedestal on a layer of gate oxide; and
    using said gate pedestal as a mask, forming source and drain regions of a second conductivity type that immediately abut said gate oxide, thereby forming said field effect transistor and whereby said field effect transistor has an electrical performance as good as a device that is similar in all respects to said field effect transistor except for the absence of said nitrogen bearing layer.

9. The process described in claim 8 wherein said gate pedestal has a width between about 0.05 and 0.25 microns.

10. The process described in claim 8 wherein the step of decoupled plasma nitridation further comprises using between about 250 and 350 watts of RF power at a pressure of $1-3\times10^{-2}$ torr for 10–300 seconds.

11. The process described in claim 8 wherein said nitrogen bearing layer is selected from the group consisting of silicon nitride and silicon oxynitride.

12. The process described in claim 8 wherein said nitrogen bearing layer contains at least 3 atomic percent nitrogen.

13. The process described in claim 8 wherein said mixture of nitrogen and oxygen contains between about 10 and 30 volume percent oxygen.

14. The process described in claim 8 wherein said distance that said nitrogen bearing layer extends downwards from said upper surface is between about 2 and 10 Angstroms.

15. The process described in claim 8 wherein said layer of silicon oxide has a thickness between about 8 and 30 Angstroms.

* * * * *